United States Patent
Yagita et al.

(10) Patent No.: US 7,315,034 B2
(45) Date of Patent: Jan. 1, 2008

(54) IRRADIATION SYSTEM WITH ION BEAM/CHARGED PARTICLE BEAM

(75) Inventors: Takanori Yagita, Ehime (JP); Takashi Nishi, Ehime (JP); Michiro Sugitani, Ehime (JP); Junichi Murakami, Ehime (JP); Mitsukuni Tsukihara, Ehime (JP); Mitsuaki Kabasawa, Ehime (JP); Masaki Ishikawa, Ehime (JP); Tetsuya Kudo, Ehime (JP)

(73) Assignee: Sen Corporation, An Shi and Axcelis Company, Tokyo (JP)

( * ) Notice: Subject to any disclaimer, the term of this patent is extended or adjusted under 35 U.S.C. 154(b) by 340 days.

(21) Appl. No.: 11/202,101

(22) Filed: Aug. 12, 2005

(65) Prior Publication Data

US 2006/0113467 A1    Jun. 1, 2006

(30) Foreign Application Priority Data

Nov. 30, 2004  (JP)  .............................. 2004-346309

(51) Int. Cl.
    *H01J 37/147* (2006.01)
(52) U.S. Cl. .......................... 250/492.21; 250/396 ML
(58) Field of Classification Search .......... 250/492.21, 250/396 ML; 335/210, 213
See application file for complete search history.

(56) References Cited

U.S. PATENT DOCUMENTS 4,839,523 A * 6/1989 Taya et al. ............... 250/492.2
5,177,366 A * 1/1993 King et al. ............... 250/492.2
5,393,984 A * 2/1995 Glavish ............... 250/396 ML
5,483,077 A * 1/1996 Glavish .................... 250/492.2
6,835,930 B2 * 12/2004 Benveniste et al. ......... 250/298
6,946,667 B2 * 9/2005 Chen et al. ............ 250/492.21
7,105,839 B2 * 9/2006 White .................... 250/492.21
2002/0007796 A1 * 1/2002 Gorokhovsky ........ 118/723 ER
2003/0066976 A1 * 4/2003 Chen et al. ............ 250/492.21
2004/0168637 A1 * 9/2004 Gorokhovsky ........ 118/723 ER

FOREIGN PATENT DOCUMENTS

JP       2003-288857 A    10/2003

* cited by examiner

Primary Examiner—Robert Kim
Assistant Examiner—Johnnie L Smith, II
(74) Attorney, Agent, or Firm—Arent Fox LLP (57) ABSTRACT

In an irradiation system with an ion beam/charged particle beam having an energy filter, the energy filter is formed by deflection electrodes and a deflection magnet which can be switchingly used. The deflection magnet has a general window-frame shape and is formed with a hollow portion at its center. The deflection electrodes are installed, along with suppression electrodes, in a vacuum chamber arranged in the hollow portion of the deflection magnet. The deflection electrodes are installed with respect to the deflection magnet such that a deflection trajectory of a beam caused by a magnetic field and a deflection trajectory of a beam caused by an electric field overlap each other. Since the deflection electrodes and the deflection magnet can be switchingly used, the system can deal with a wider range of beam conditions and thus is widely usable.

18 Claims, 9 Drawing Sheets

FIG. 2

⊙⊗ :DIRECTION OF MAGNETIC FIELD

FIG. 3A

⊙⊗ :DIRECTION OF MAGNETIC FIELD

IRRADIATION SYSTEM WITH ION BEAM/CHARGED PARTICLE BEAM

This application claims priority to prior Japanese patent application JP 2004-346309, the disclosure of which is incorporated herein by reference.

BACKGROUND OF THE INVENTION

This invention relates to an irradiation system with an ion beam/charged particle beam and, in particular, relates to an energy filter for use therein.

An irradiation system with an ion beam/charged particle beam (also called an ion implantation system; hereinafter referred to simply as a "irradiation system with a beam") is a system for applying a mass analysis to ions or charged particles extracted from a beam source to thereby select only a necessary ion species or necessary charged particles and irradiating a wafer with the beam.

Among this type of irradiation systems with the beam, there is available one having, in addition to a mass analyzer, an energy filter called an angular energy filter (AEF) in order to more accurately implant ions or charged particles into a wafer.

The angular energy filter applies a magnetic field or an electric field to an ion beam/charged particle beam passing therethrough to deflect it by a Lorentz force so as to irradiate the wafer with only those ions or charged particles each having a predetermined energy.

The conventional irradiation system with ion beam/charged particle beam comprises, as the angular energy filter, either a deflection magnet for producing a magnetic field or deflection electrodes for producing an electric field depending on the intended use (irradiation conditions etc.). For example, the system comprising the deflection electrodes is disclosed in JP-A-2003-288857.

The conventional irradiation system with ion beam/charged particle beam comprises, as the energy filter, either a deflection magnet for producing a dipole magnetic field or deflection electrodes for producing an dipole electric field. Therefore, there is a problem that the conventional irradiation system with ion beam/charged particle beam is limited in its use (beam conditions etc.).

SUMMARY OF THE INVENTION

An irradiation system with an ion beam/charged particle beam which is configured that the beam transformed by a beam transformer from a circular cross-section or an elliptical or oval cross-section to an elliptical or oval cross-section that is long in scanning direction after deflection for scanning, is subjected to an energy analysis by an energy filter configured to bend the beam at a uniform angle at any positions overall in a scanning-deflection area thereof, and then is incident on an irradiation target, wherein the energy filter comprises deflection electrodes and a deflection magnet, and a switching device is provided to switch among the deflection electrodes and the deflection magnet and both of them depending on a condition for the use of the ion beam/charged particle beam, and the turning point of the trajectory of the ion beam/charged particle beam bent by the deflection electrodes and the turning point of the trajectory of the ion beam/charged particle beam bent by the deflection magnet are identical.

According to the second aspect of this invention, in the irradiation system with ion beam/charged particle beam according to the first aspect, the deflection electrodes are installed in an AEF vacuum chamber arranged in a hollow portion of yokes of the deflection magnet.

According to the third aspect of this invention, in the irradiation system with ion beam/charged particle beam according to the first aspect, yokes of the deflection magnet are formed into a general window-frame shape having a hollow portion at its center and is configured that a beam line passes through the hollow portion, and the AEF vacuum chamber is provided in the hollow portion of the yokes and the deflection electrodes are installed in the AEF vacuum chamber.

According to the fourth aspect of this invention, in the irradiation system with ion beam/charged particle beam according to the second or the third aspect, the side view of each side yoke of the deflection magnet has a almost sector shape with no face rotational angle and the upper yoke is long in the longitudinal direction and the lower yoke is long in a direction perpendicular to the longitudinal direction.

According to the fifth aspect of this invention, in the irradiation system with ion beam/charged particle beam according to the second, the third or the fourth aspect, the AEF vacuum chamber is fixedly supported by a process vacuum chamber which is installed at a downstream side of the deflection magnet.

According to the sixth aspect of this invention, in the irradiation system with beam/charged particle beam according to the fifth aspect, the AEF vacuum chamber is supported by a support rod on an upstream side thereof.

According to the seventh aspect of this invention, in the irradiation system with ion beam/charged particle beam according to any one of the second to the sixth aspects, electron suppression electrodes are respectively installed at upstream and downstream sides of the deflection electrodes in the AEF vacuum chamber and both upper and lower electrode of the deflection electrodes are supplied with a high voltage.

According to the eighth aspect of this invention, in the irradiation system with ion beam/charged particle beam according to any one of the second to the seventh aspects, the deflection electrodes are formed as a unit and are pushable into and drawable from the AEF vacuum chamber by the use of rails.

According to the ninth aspect of this invention, in the irradiation system with ion beam/charged particle beam according to the eighth aspect, one of the side yokes of the magnetic pole of the deflection magnet is supported so as to be separately movable from the upper and the lower yokes in order to allow the deflection electrodes to be pushable into and drawable from the AEF vacuum chamber.

According to the tenth aspect of this invention, in the irradiation system with ion beam/charged particle beam according to any one of the first to the ninth aspect, a through hole is formed in both magnetic poles (side yokes) of the deflection magnet so as to perform a power feed to the deflection electrodes through the through hole.

According to the eleventh aspect of this invention, in the irradiation system with ion beam/charged particle beam according to any one of the first to the tenth aspects, the inner surface of each deflection electrode has such a curvature that matches with a radius of curvature of the center trajectory of the beam.

According to the twelfth aspect of this invention, in the irradiation system with ion beam/charged particle beam according to any one of the first to eleventh aspects, the energy filter comprises a beam dump for receiving thereon a neutralized beam, and a beam having a different energy and ions of different charge state.

According to the thirteenth aspect of this invention, there is provided an irradiation system with an ion beam/charged particle beam which is configured that an ion beam/charged particle beam analyzed by a mass analysis electromagnet is introduced to deflection electrodes or a deflection magnet for scanning, then is caused to pass through a beam parallelizing device formed by electrodes or a magnet, then is accelerated or decelerated, then is subjected to an energy analysis by an energy filter configured to bend the beam at a uniform angle at any positions overall in a scanning-deflection area thereof, and then is incident on an irradiation target, wherein the energy filter comprises deflection electrodes and a deflection magnet, a switching device is provided to switch among the deflection electrodes and the deflection magnet and both of them depending on a conditions for the use of the ion beam/charged particle beam, and the deflection electrodes are installed with respect to the deflection magnet such that the turning point of the trajectory of the ion beam/charged particle beam bent by the deflection electrodes and the turning point of the trajectory of the ion beam/charged particle beam bent by the deflection magnet are identical.

According to the fourteenth aspect of this invention, in the irradiation system with ion beam/charged particle beam according to the thirteenth aspect, the trajectory of the ion beam/charged particle beam in the energy analysis by the deflection electrodes and the trajectory of the ion beam/charged particle beam in the energy analysis by the deflection magnet overlap each other on a beam incident side and a beam outgoing side of the energy filter.

According to the fifteenth aspect of this invention, there is provided an irradiation system with an ion beam/charged particle beam which is configured that an ion beam/charged particle beam purified by a mass analysis and having an elliptical or oval cross-section that is long in the scanning direction is subjected to an energy analysis by an energy filter configured to bend the beam at a uniform angle at any positions overall in a scanning-deflection area thereof and then is incident on an irradiation target, wherein the energy filter comprises deflection electrodes and a deflection magnet, a switching device is provided to switch among the deflection electrodes, and the deflection magnet and both of them depending on a conditions for the use of the ion beam/charged particle beam, and the deflection electrodes are installed with respect to the deflection magnet such that the turning point of the trajectory of the ion beam/charged particle beam bent by the deflection electrodes and the turning point of the trajectory of the ion beam/charged particle beam bent by the deflection magnet are identical.

According to the sixteenth aspect of this invention, in the irradiation system with ion beam/charged particle beam according to the fifteenth aspect, wherein the trajectory of the ion beam/charged particle beam in the energy analysis by the deflection electrodes and the trajectory of the ion beam/charged particle beam in the energy analysis by the deflection magnet overlap each other on the upstream side and the downstream side of the energy filter.

DESCRIPTION OF THE PREFERRED EMBODIMENT

Now, the best mode for carrying out the invention will be described in detail with reference to the drawings.

Figure 1A:
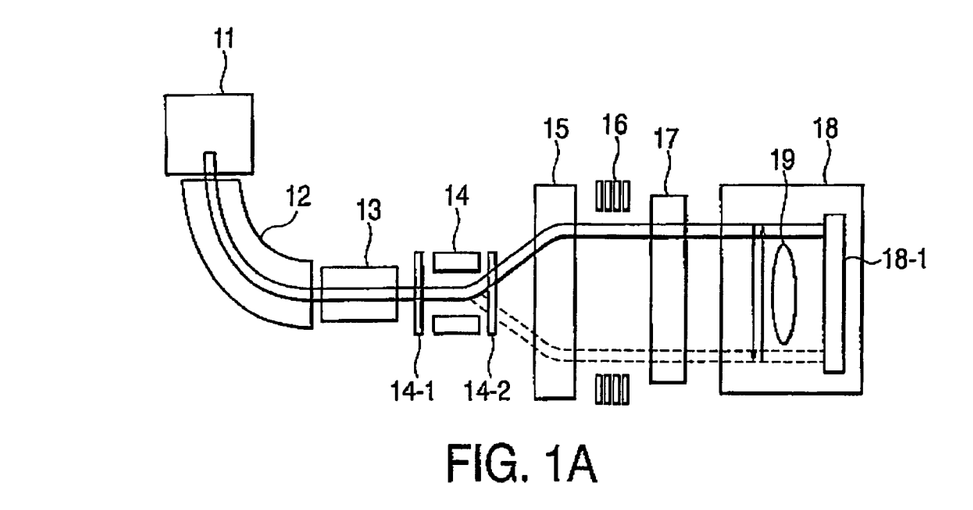
FIGS. 1A and 1B are a plan view and a side view, respectively, showing a schematic structure of an irradiation system with an ion beam/charged particle beam according to an embodiment of this invention.
Figure 1B:
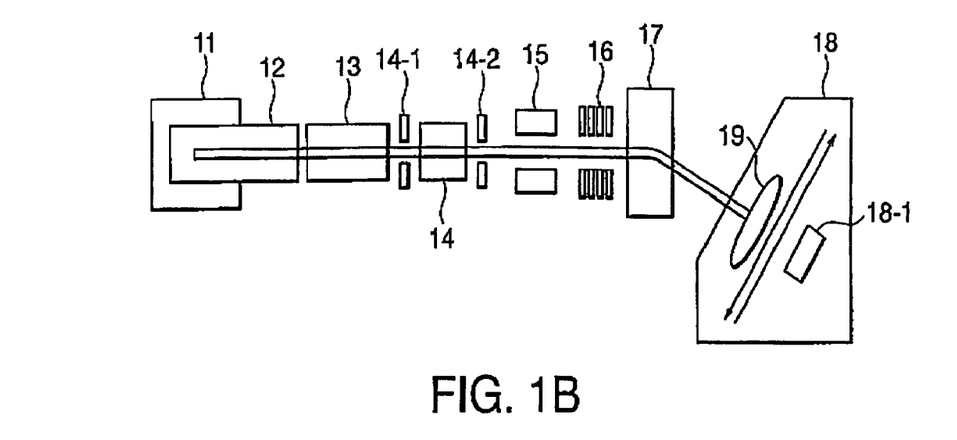

FIGS. 1A and 1B are a plan view and a side view, respectively, showing a schematic structure of an irradiation system with an ion beam/charged particle beam (hereinafter abbreviated as a "irradiation system with a beam") according to an embodiment of this invention.

The illustrated irradiation system with a beam comprises an ion source 11, a mass analysis magnet device 12, a beam transformer 13, a deflector for scanning 14, a P (Parallelizing)-lens 15, acceleration/deceleration electrodes (in an A/D columns) 16, an angular energy filter (AEF) 17, and a process vacuum chamber 18.

In this irradiation system with a beam, ions or charged particles generated in the ion source 11 are extracted through extraction electrodes (not illustrated) as an ion beam or a charged particle beam (hereinafter referred to as a "beam"). The extracted beam is subjected to a mass analysis in the mass analysis magnet device 12 so that only a predetermined ion species is selected. The beam composed of only the predetermined ion species is transformed in cross-section by the beam transformer 13. The beam transformer 13 is composed of Q (Quadrupole)-lenses and so on. The beam having the adequate cross-sectional shape is swung reciprocally in the direction perpendicular to the center orbit in FIG. 1A by the deflector for scanning 14. The deflector for scanning 14 has electron suppression electrodes 14-1 and 14-2 that are installed at the upstream and downstream sides of the deflector for scanning 14, respectively. Although deflection electrodes for scanning are used as the deflector for scanning 14 in this embodiment, a deflection magnet for scanning may be used in place of them.

The beam swung reciprocally by the deflector for scanning 14 is parallelized by the P-lens 15 formed by electrodes or a magnet so that all the swung orbits are parallel to a scan-center axis of a deflection angle of zero degree. In FIG. 1A, a swing range of the beam by the deflector for scanning 14 is indicated by a thick black line and double broken lines. The beam from the P-lens 15 is accelerated or decelerated by one or more acceleration/deceleration electrodes 16 and sent to the angular energy filter 17. The angular energy filter 17 performs an analysis about energy of the beam to thereby select only an ion species having a predetermined energy. As shown in FIG. 1B, only the selected ion species with a selected energy is deflected correctly downward by the angular energy filter 17. The wafer 19 is irradiated with the beam composed only of thus selected ion species being introduced in the process vacuum chamber 18 as an irradiation target. The beam that is not incident on the wafer 19 is injected into a beam stopper 18-1 provided in the process vacuum chamber 18 so that energy thereof. Is consumed.

In FIG. 1A, arrows shown adjacent to the wafer 19 represent that the beam is deflected for scanning in the directions of these arrows (horizontal direction), while, in FIG. 1B, arrows shown adjacent to the wafer 19 represent that the wafer 19 itself is moved in directions of these arrows (vertical direction). Specifically, assuming that the wafer is reciprocally scanned with the beam, for example, x-axis directions, the wafer 19 is also moved reciprocally by a drive mechanism (not illustrated) so as to be irradiated uniformly also in y-axis directions perpendicular to the x-axis directions. This enables the target wafer 19 to be irradiated with the beam over the whole surface uniformly.

In the manner as described above, in the irradiation system with the beam shown in FIGS. 1A and 1B, a beam having an elliptical or oval cross-section that is long in scanning direction (horizontal direction in FIG. 1A) can be obtained and then bent at a uniform angle at any positions overall in a scanning-deflection area thereof by the use of the angular energy filter serving as an energy filter so that the wafer is irradiated with the beam with the uniform incident angle.

Referring now to FIGS. 2 to 7, description will be given in detail about the angular energy filter 17 used in the irradiation system with the beam according to this embodiment.

Figure 2:
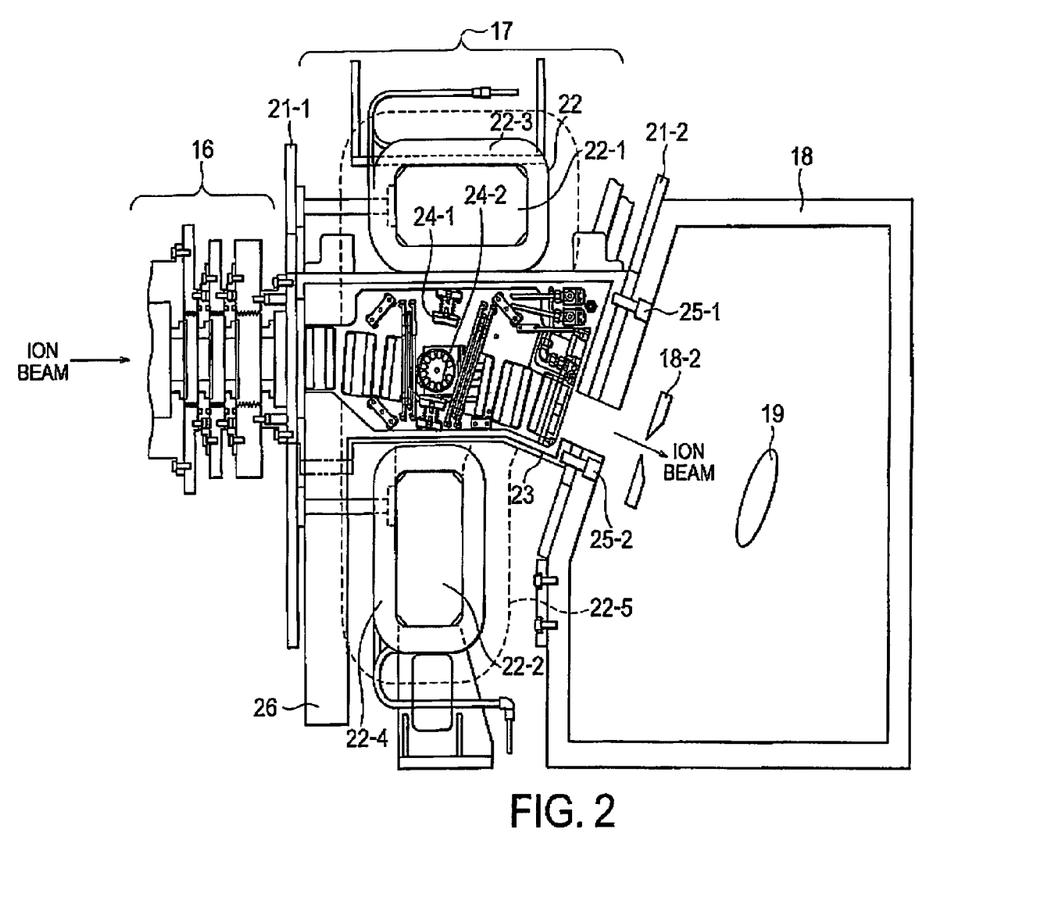
FIG. 2 is a diagram for explaining arrangement and structure of an angular energy filter included in the irradiation system with ion beam/charged particle beam shown in FIG. 1.

As shown in FIG. 2, the angular energy filter 17 comprises a pair of magnetic shields 21-1 and 21-2, a deflection magnet (window frame type dipole magnet) 22 installed between the magnetic shields 21-1 and 21-2, an AEF chamber (also called a AEF vacuum chamber or a beam line guide) 23 installed in a hollow portion of the deflection magnet 22, and a pair of deflection electrodes 24-1 and 24-2 installed in the AEF vacuum chamber 23.

The magnetic shields 21-1 and 21-2 each have an opening (e.g. a rectangular opening long in a direction perpendicular to the sheet surface of FIG. 2) at its center portion for passing the beam therethrough and are respectively fixed to the acceleration/deceleration column 16 and the process vacuum chamber 18. The magnetic shields 21-1 and 21-2 serve to shield a magnetic field generated by the deflection magnet 22 to thereby reduce an influence of the magnetic field acting on the beam and electrons for wafer charge compensation.

The deflection magnet 22 comprises a generally quadrangular (window frame type) core as will be described later, and one or more main coils 22-3 and 22-4 respectively wound on an upper yoke 22-1 and a lower yoke 22-2 which are a part of the core. Further, as shown by a broken line in FIG. 2, canceling correction coils (only one shown) 22-5 for leakage magnetic field cancellation may be wound on the core outside the coils 22-3 and 22-4 (on the front and back sides of the sheet of FIG. 2) so as to cover both side edges of the upper and lower yokes 22-1 and 22-2 and side yokes. The canceling correction coils 22-5 for leakage magnetic field cancellation are used for canceling unwanted portions of magnetic fields (leakage magnetic fields) at the target wafer generated by the coils 22-3 and 22-4. The directions of the magnetic field generated by the coils 22-3 and 22-4 are illustrated in FIG. 3A while the directions of that generated by the canceling correction coils 22-5 are illustrated in FIG. 3B.

Figure 3A:
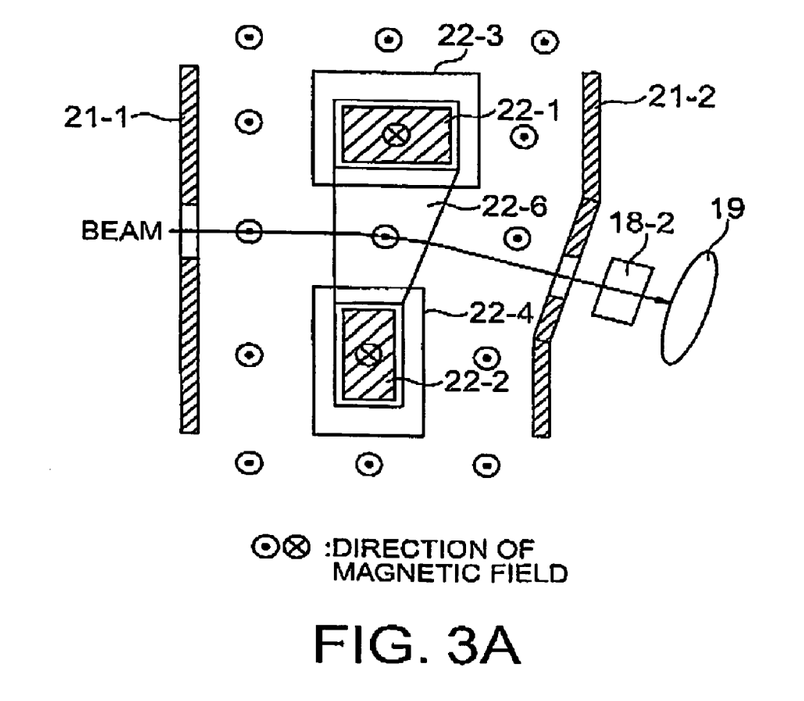
FIG. 3A is a diagram showing directions of a magnetic field generated by (main) coils of the deflection magnet shown in FIG. 2.
Figure 3B:
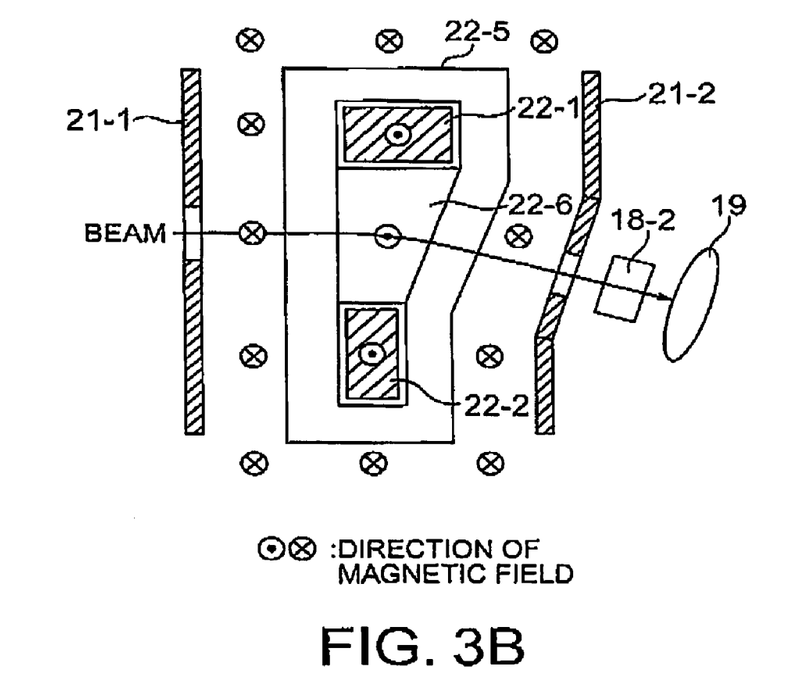
FIG. 3B is a diagram showing directions of a magnetic field generated by canceling correction coils.

As understood from a comparison between FIGS. 3A and 3B, the magnetic field generated in a hollow portion 22-6 of the deflection magnet 22 by the coils 22-3 and 22-4 and the magnetic field generated also in the hollow portion 22-6 by the canceling correction coils 22-5 have the same direction. However, the magnetic field generated around the deflection magnet 22 by the coils 22-3 and 22-4 and the magnetic field generated around the deflection magnet 22 by the canceling correction coils 22-5 have the opposite directions. Therefore, by properly controlling (balancing) the currents supplied to the respective coils, it is possible to form a uniform magnetic field having a desired magnetic flux density in the hollow portion 22-6 of the deflection magnet 22 and further cancel the magnetic fields each other that are generated around the deflection magnet 22. That is, by controlling the current supplied to the canceling correction coils 22-5, it is possible to control the spread of magnetic field distribution to thereby suppress the leakage magnetic field. Further, by adjusting the currents supplied to the coils 22-3 and 22-4 and the canceling correction coils 22-5, it is possible to generate a uniform magnetic field distribution where the beam is bent (or deflected) at the same deflection angle regardless of where the beam passes in the hollow portion 22-6, i.e. a magnetic field where the BL product is uniform. Thus, the deflection magnet 22 bends or deflects the beam at a uniform angle at any positions overall in a scanning-deflection area thereof.

The magnetic shields 21-1 and 21-2 adjust the magnetic field distribution and facilitate the adjustment of the currents supplied to the respective coils for achieving the same deflection angle of the beam regardless of a beam passing position in the hollow portion 22-6. That is, the magnetic shields 21-1 and 21-2 facilitate realizing the magnetic field distribution where the BL product is uniform. The adjustment of the magnetic field distribution by the magnetic shields 21-1 and 21-2 is carried out by determining the shape of an opening of each magnetic shield depending on an ion species, a beam cross-sectional shape (e.g. circular, oval, elliptical, or the like), a scan range, an implantation energy, and so on.

Returning to FIG. 2, the deflection magnet 22, in operation, generates the magnetic field at the hollow portion in the direction perpendicular to the sheet surface of FIG. 2 (e.g. directed toward the back of the sheet of FIG. 2) so that the beam advancing from left to right in the figure is deflected downward. As a result, the beam passes through an energy slit 18-2 provided in the process vacuum chamber 18 installed at the downstream side (on the right side in FIG. 2) of the deflection magnet 22 and is incident on the target wafer 19 introduced and retained in the process vacuum chamber 18. Note that the scanning-deflection area with the beam is long in the direction perpendicular to the sheet surface of FIG. 2. The angular energy filter 17 bends or deflects the beam at the uniform angle at any positions overall in a scanning-deflection area thereof.

The AEF vacuum chamber 23 provided in the hollow portion of the deflection magnet 22 is fixed at its downstream side, along with the magnetic shield 21-2, to the process vacuum chamber 18 by the use of support bolts 25-1 and 25-2. The upstream side (the left side in FIG. 2) of the AEF vacuum chamber 23 is auxiliarily supported by a support rod 26 from the lower side. In this manner, by employing the support and fixing structure in which the AEF vacuum chamber 23 is fixed to the process vacuum chamber 18 while supported by the support rod 26 auxiliary, the AEF vacuum chamber 23 can be precisely aligned in position although surrounded by the core and coils of the deflection magnet 22 and further by other components.

Figure 4:
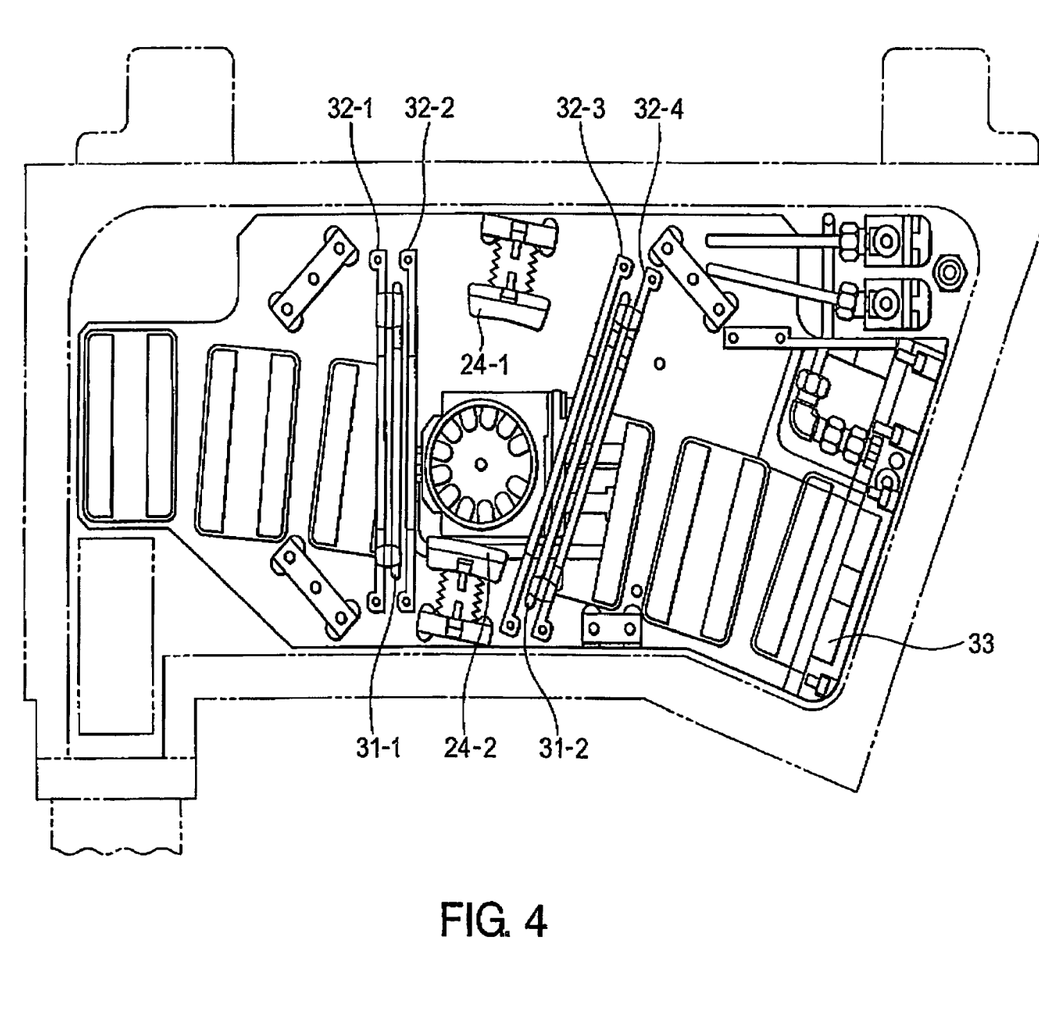
FIG. 4 is a diagram for explaining an internal structure of an AEF vacuum chamber included in the angular energy filter shown in FIG. 2.
Figure 5:
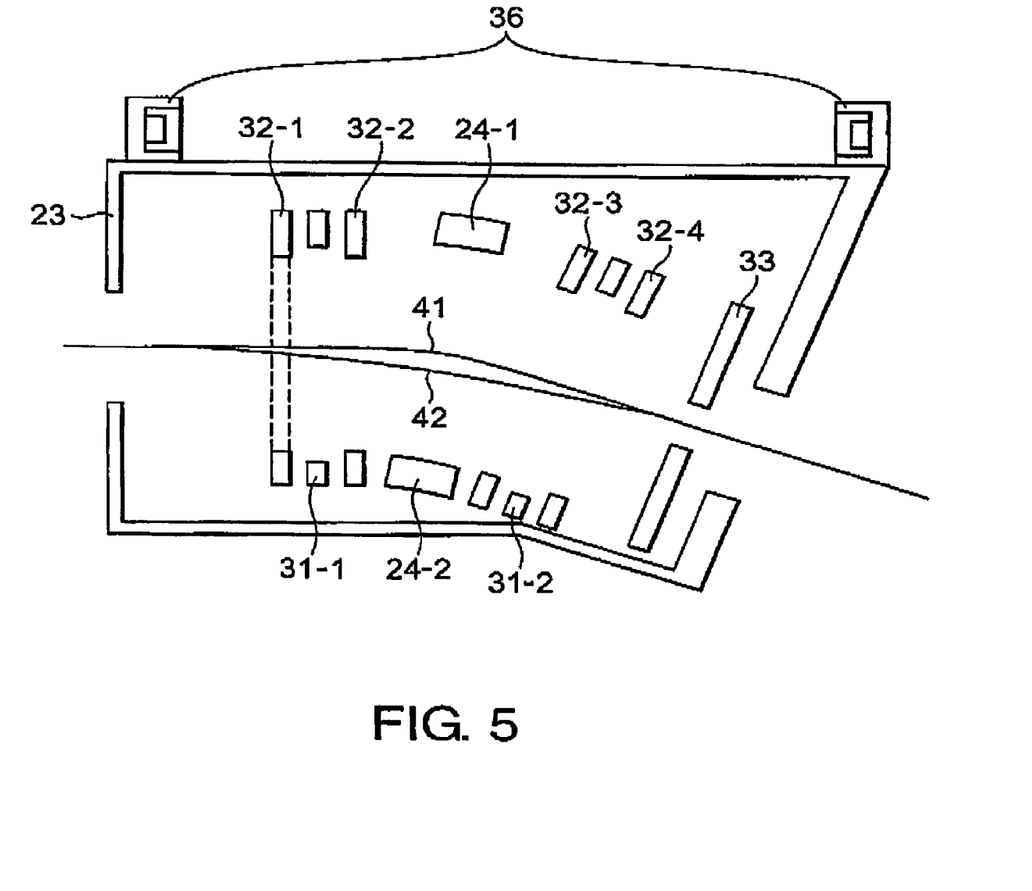
FIG. 5 is a diagram for explaining arrangement of deflection electrodes in the AEF vacuum chamber shown in FIG. 4 and is an exemplary diagram showing trajectories of a beam when a deflection magnet and the deflection electrodes are respectively used.

In the AEF vacuum chamber 23, as shown in FIG. 4 on an enlarged scale, there are provided, in addition to the foregoing deflection electrodes 24-1 and 24-2, electron suppression electrodes 31-1 and 31-2 respectively located on the upstream and downstream sides of the deflection electrodes 24-1 and 24-2, ground electrodes 32-1 and 32-2 respectively located on the upstream and downstream sides of the electron suppression electrode 31-1, ground electrodes 32-3 and 32-4 respectively located on the upstream and downstream sides of the electron suppression electrode 31-2, and a beam dump 33 located on the most downstream side.

The deflection electrodes 24-1 and 24-2, the electron suppression electrodes 31-1 and 31-2, and the ground electrodes 32-1 to 32-4 are installed and supplied with the power so that the turning point (the cross point of two straight lines that are the beam center trajectories before and after the AEF) obtained when the beam 18 deflected by an electric field of these electrodes is identical with the turning point formed when the beam is deflected by the magnetic field of the deflection magnet 22. Specifically, as exemplarily shown in FIG. 5, these electrodes are arranged so that a trajectory 41 of the beam deflected by the produced electric field overlaps a trajectory 42 of the beam deflected by the magnetic field generated by the use of the deflection magnet 22 at least on an incident and an outgoing side of the AEF vacuum chamber 23, i.e. the angular energy filter 17. By providing the electron suppression electrodes 31-1 and 31-2 and the ground electrodes 32-1 to 32-4, it becomes possible to apply a higher voltage across the deflection electrodes 24-1 and 24-2 and, therefore, even when the energy of the beam is larger, a desired trajectory can be realized. Further, the cross-sectional shape of each of the deflection electrodes 24-1 and 24-2 is curved (the deflection electrode 24-1 has a concave shape while the deflection electrode 24-2 has a convex shape) so as to match a radius of curvature of the beam (or the center of the trajectory of the beam) and thus the beam can be deflected efficiently.

The beam dump 33 has an opening for passing therethrough the beam deflected correctly by the magnetic field or the electric field and allows ions each having a required energy and a charge state to pass therethrough. On the other hand, the beam dump 33 receives thereon a neutralized beam or a beam whose energy or charge state differs from a predetermined value.

The components in the AEF vacuum chamber 23 including the deflection electrodes 24-1 and 24-2, the electron suppression electrodes 31-1 and 31-2, the ground electrodes 32-1 to 32-4, and the beam dump 33 are formed as a single unit (AEF unit). Specifically, the electrodes 24-1, 24-2, 31-1, 31-2, and 32-1 to 32-4 and the beam dump 33 are, along with other components, fixed to a common plate or the like and integrated together.

Figure 6A:
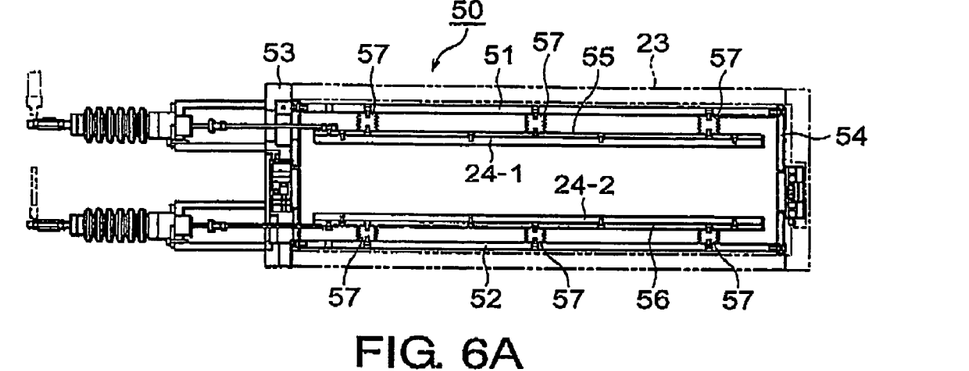
FIG. 6A is a cross-sectional view (front view) of an AEF deflection electrode unit which is perpendicular to the beam center orbit, taken along a plane including centerlines of the deflection electrodes.
Figure 6B:
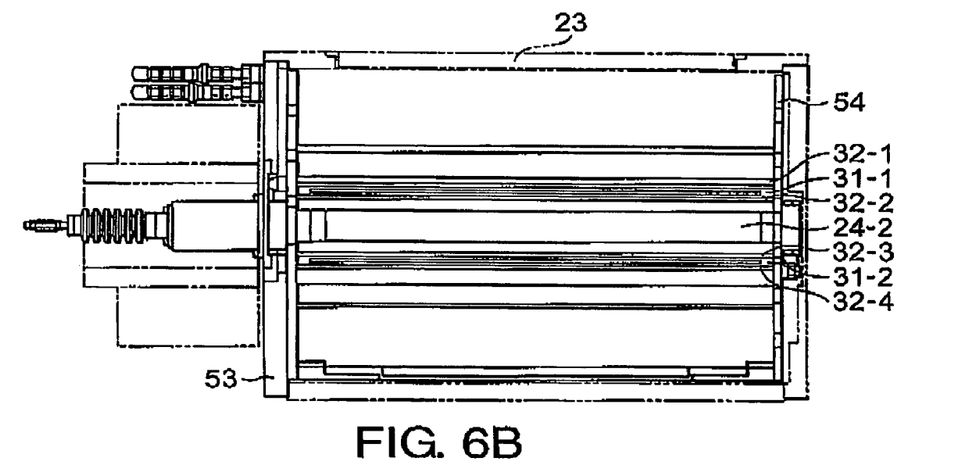
FIG. 6B is a cross-sectional view (top view) of the AEF deflection electrode unit, taken along a plane including center trajectories of the injected beam.
Figure 6C:
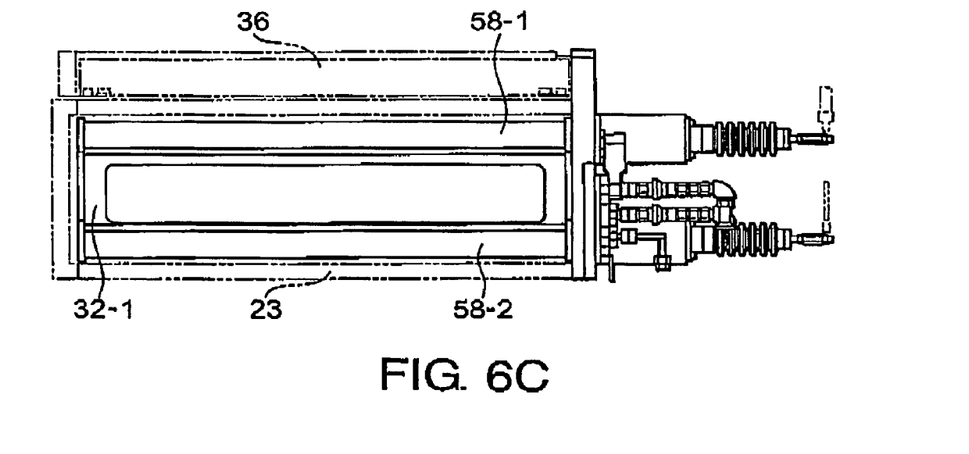
FIG. 6C is a diagram of the AEF deflection electrode unit, as seen from a beam incident side, of the AEF vacuum chamber.

One example of the AEF unit is shown in FIGS. 6A, 6B, and 6C. FIG. 6A is a cross-sectional front view taken along a plane including centerlines of the respective deflection electrodes 24-1 and 24-2 and is a diagram, as seen from the beam outgoing side (downstream side), of an AEF unit 50. FIG. 6B is a cross-sectional top view taken along a path of the incident beam and is a diagram, as seen from above, of the AEF unit 50. FIG. 6C is a diagram, as seen from the beam injecting side (upstream side), of the AEF vacuum chamber 23.

As shown in FIG. 6A, the AEF unit 50 comprises an upper support 51, a lower support 52, a left-side plate 63 serving as part (the left-side wall) of the AEF vacuum chamber 23, and the right-side plate 54. The deflection electrodes 24-1 and 24-2 are respectively mounted to insulated mount plates 55 and 56 and fixed to the upper and lower supports 51 and 52 through a plurality of insulators 57.

As shown in FIGS. 6B and 6C, the other components in the AEF vacuum chamber 23, including the electron suppression electrodes and so on, are also respectively fixed to the upper support 51, the lower support 52, the left-side plate 53, and the right-side plate 54 directly or through auxiliary supports 58-1 and 58-2 and so on and thus integrated together.

Further, as shown in FIG. 6C, left ends of a pair of slide rails 36 placed on the inner top surface of the AEF vacuum chamber 23 are fixed to the left-side plate 53 at its upper edge portion. With this arrangement, the AEF unit 50 is supported so as to be movable in and out with respect to the AEF vacuum chamber 23. To align the AEF unit 50 at a predetermined position when the AEF unit 50 is inserted into the AEF vacuum chamber 23, the right-side plate 54 may be provided with a positioning portion (e.g. a projection for an acceptor).

Figure 7A:
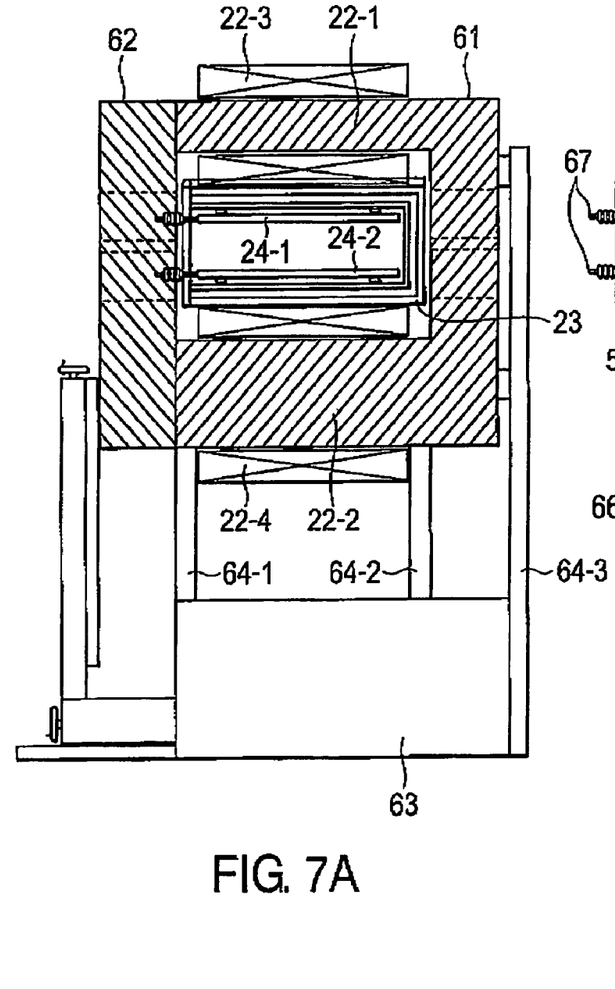
FIGS. 7A and 7B are diagrams for explaining structures of the deflection magnet and the AEF vacuum chamber that can facilitate maintenance of the deflection electrodes included in the angular energy filter shown in FIG. 2.
Figure 7B:
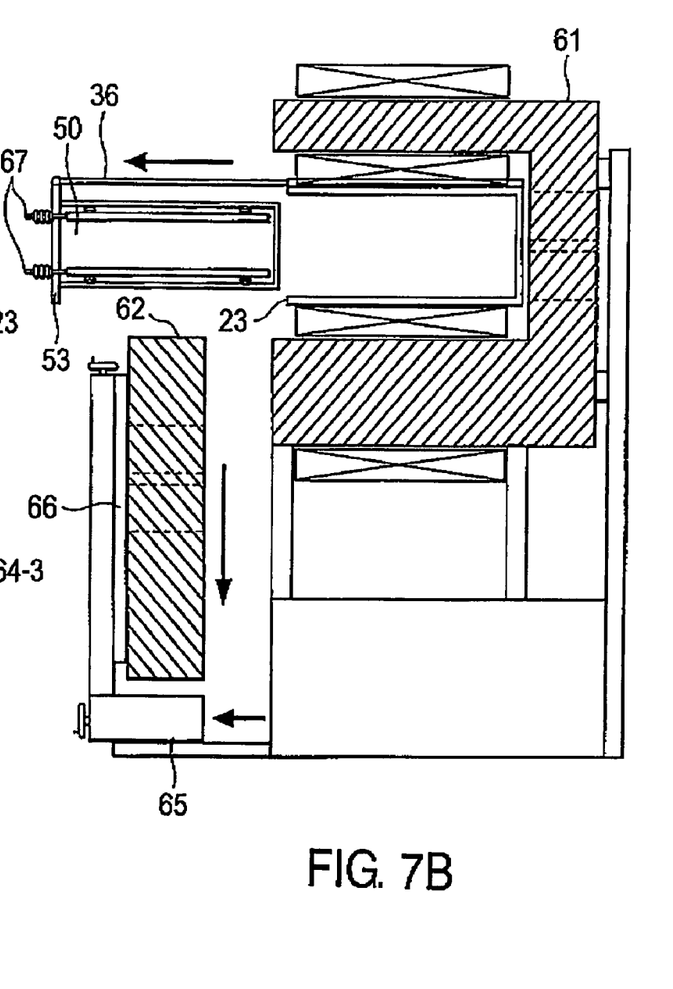

Now, the deflection magnet 22 will be described. Referring to FIGS. 7A and 7B, the deflection magnet 22 comprises a almost reversed "C"-shaped first core 61 and a almost I-shaped second core 62. The window frame type (quadrangular) core with the hollow portion at its center is constituted by fixing the movable second core 62 to the settled first core 61. Horizontally long upper part of the first core 61 is the upper yoke 22-1 and horizontally long lower part of core 61 is the lower yoke 22-2, respectively, and the coils 22-3 and 22-4 are wound around them, respectively, to form an electromagnet.

Figure 8:
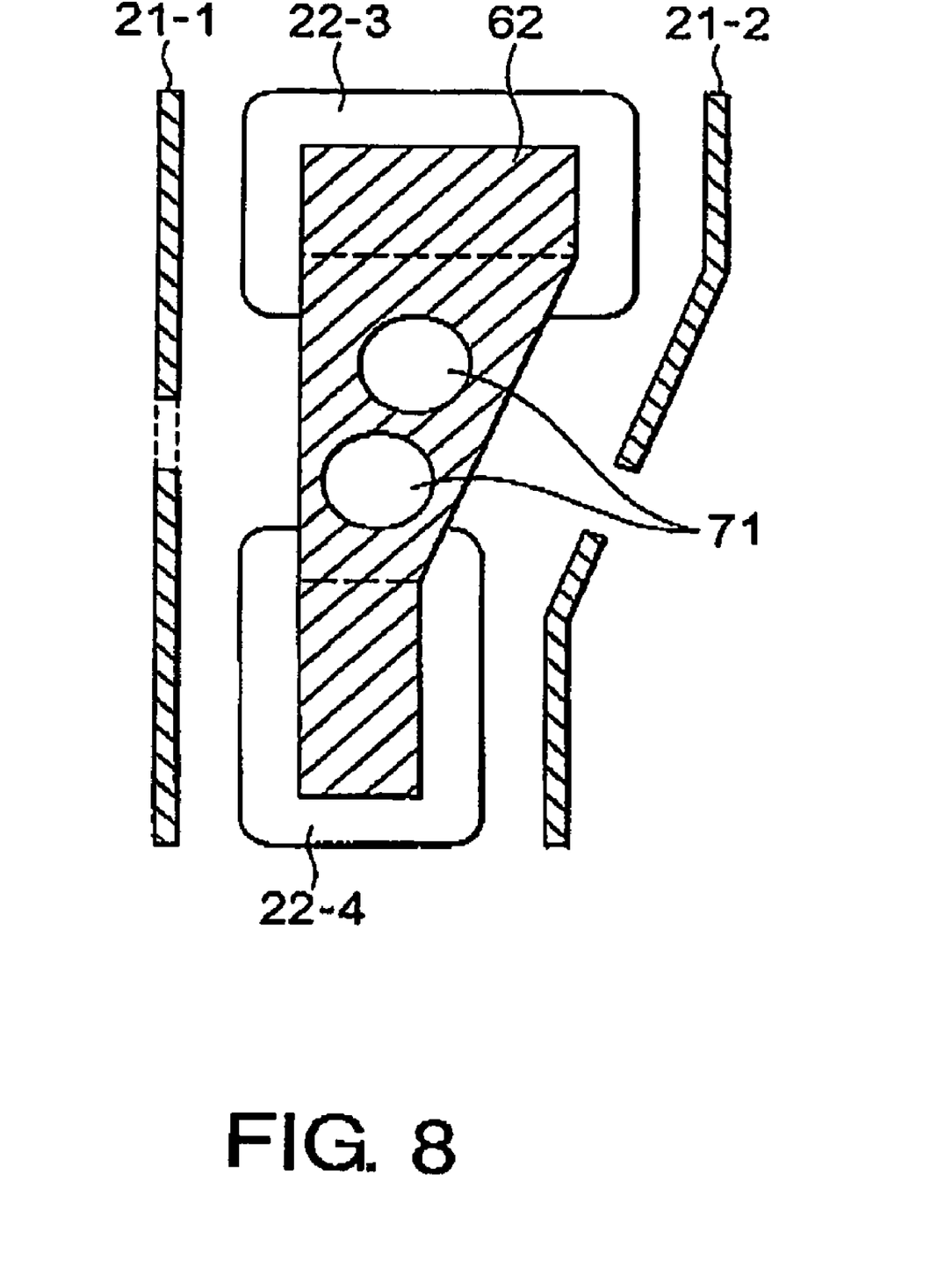
FIG. 8 is a diagram for explaining the shape of a second core (side yoke) of the deflection magnet included in the angular energy filter shown in FIG. 2.
Figure 9:
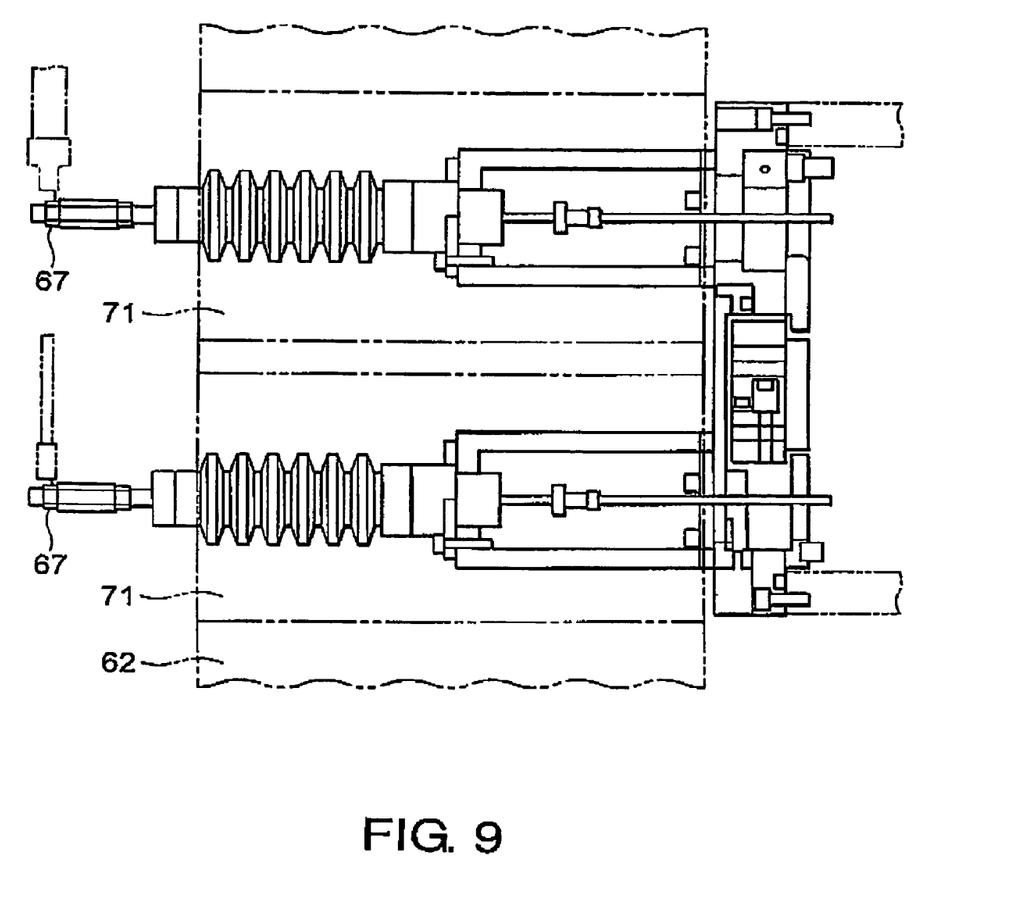
FIG. 9 is a diagram for explaining the structure of external connection terminals connected to the deflection electrodes with respect to the structure of high-voltage supply through holes formed in the second core (side yoke).

As shown in FIG. 8, through holes 71 for supplying high-voltage to the deflection electrodes 24-1 and 24-2 are made in a part of the second core 62 that serves as a magnetic pole. Though external connection terminals 67 connected to the deflection electrodes 24-1 and 24-2 are depicted so small that it locks to be accommodated in the through holes 71 in FIG. 7A, actually as shown in FIG. 9, each external connection terminals 67 has a size such that at least its connector head is exposed to the exterior of the high-voltage supply through hole 71.

On the other hand, a portion of the first core 61 that also serves as another magnetic pole has through holes with the same shape of the high-voltage supply through holes 71 (shown by broken lines in FIGS. 7A and 7B) so that an uniform magnetic field is generated between the magnetic poles.

As understood from FIGS. 2 and 8, the upper yoke 22-1 has a cross-sectional shape that is long in the beam advancing direction (longitudinal direction i.e., leftward/rightward direction in FIG. 2 or 8), while the lower yoke 22-2 has a cross-sectional shape that is long in a direction perpendicular to the beam advancing direction (vertical direction i.e., upward/downward direction in FIG. 2 or 8). In the longitudinal direction, the shape of the core is a sector type with no pole-face rotational angle that is wide on the side of the upper yoke 22-1 while narrow on the side of the lower yoke 22-2. It is preferable that the cross-sectional area of the upper yoke 22-1 and that of the lower yoke 22-2 be equal to each other for generating the uniform magnetic field in the vertical direction.

Referring again to FIGS. 7A and 7B, the first core 61 is fixed to a base 63 through a plurality of support columns 64-1 to 64-3. A first linear guide 65 is movable in the horizontal direction and a second linear guide 66 is mounted on the first linear guide 65 and movable in the vertical direction. The second core 62 is fixed to the second linear guide 66 provided on the first linear guide 65. By operating the first and second linear guides 65 and 66, the second core 82 is moved (slid) in the horizontal and vertical directions with respect to the first core 61 so that it is possible to achieve a change from the state shown in FIG. 7A to the state shown in FIG. 7B or, conversely, from the state shown in FIG. 7B to the state shown in FIG. 7A.

Additionally, the deflection electrodes 24-1 and 24-2, the other electrodes, and so on are, as described above, integrated together to form the AEF unit 50. The AEF unit 50 is supported so as to be pushable into and drawable from the AEF vacuum chamber 23 by the use of the slide rails 36.

When the second core 62 is separated from the first core 61 by operating the linear guides 65 and 66 in the state shown in FIG. 7A, the left plate 53 is exposed to the exterior. If the AEF unit 50 is pulled out in that state, it is possible to achieve the state shown in FIG. 7B, i.e. the state where the deflection electrodes 24-1 and 24-2 and so on are located and exposed outside the AEF vacuum chamber 23. In this manner, in this embodiment, since the deflection electrodes 24-1 and 24-2 and so on can be easily taken out from the AEF vacuum chamber 23 and exposed to the outside, the maintenance and replacement thereof can be facilitated.

After carrying out the maintenance or replacement of the components, the AEF unit 50 is pushed into the AEF vacuum chamber 23 and the left plate 53 is sealingly fixed to the AEF vacuum chamber 23 so that the deflection electrodes 24-1 and 24-2 and so on can be placed at a predetermined position within the AEF vacuum chamber 23.

With respect to the angular energy filter 17 configured as described above, a controller (not illustrated) of the irradiation system with ion beam in this embodiment selectively feeds the power to either the deflection magnet 22 or the deflection electrodes 24-1 and 24-2 depending on a condition of the ion beam/charged particle beam incident on the target wafer. That is, the controller of the irradiation system with ion beam serves as a switching device between magnetic field and electric field of the angular energy filter 17. Note that when feeding the electric power to the deflection electrodes 24-1 and 24-2, the controller of the irradiation system with the beam simultaneously feeds the electric power to the electron suppression electrodes 31-1 and 31-2.

It differs depending on an ion species or the like whether the controller of the irradiation system with the beam feeds the electric power to the deflection magnet 22 or the deflection electrodes 24-1 and 24-2. However, it may be considered that the electric power is fed to the deflection magnet 22 when the energy of the beam is lower than a certain threshold value in the range of approximately ten to several tens of keV while the electric power is fed to the deflection electrodes 24-1 and 24-2 (and the electron suppression electrodes 31-1 and 31-2) when it is higher than the threshold value.

As described above, in the irradiation system with ion beam according to this embodiment, by providing the energy filter with the deflection magnet, the deflection electrodes, and the switching device for switching them, it is possible to select whether to use a magnetic field or an electric field as a deflection method of a beam in the angular energy filter 17, depending on the beam condition (property). With this arrangement, the irradiation system according to this embodiment can deal with the wider range of beam conditions to expand its use. Further, in the irradiation system according to this embodiment, even when either the magnetic field or the electric field is selected as the deflection method of the beam in the angular energy filter 17, the trajectory of the beam does not change in outside of the AEF. Therefore, no particular trajectory correction means is required and thus the structure is simple.

In the foregoing embodiment, the description has been given about the example where the horizontally long area is scanned with an ion beam. However, this invention is also applicable when the scanning is not performed or when the cross-sectional shape of the beam is circular, elliptical, or oval.

What is claimed is:

1. An irradiation system with an ion beam/charged particle beam which is configured that the beam transformed by a beam transformer from a circular cross-section or an elliptical or oval cross-section to an elliptical or oval cross-section that is long in scanning direction after deflection for scanning, is subjected to an energy analysis by an energy filter configured to bend the beam at a uniform angle at any positions overall in a scanning-deflection area thereof, and then is incident on an irradiation target, wherein said energy filter comprises deflection electrodes and a deflection magnet, and a switching device is provided to switch among said deflection electrodes and said deflection magnet and both of them depending on a condition for the use of the ion beam/charged particle beam, and wherein the turning point of the trajectory of the ion beam/charged particle beam bent by said deflection electrodes and said turning point of said trajectory of the ion beam/charged particle beam bent by said deflection magnet are identical.

2. An irradiation system with an ion beam/charged particle beam according to claim 1, wherein said deflection magnet includes side yokes, an upper yoke, and a lower yoke, and said deflection electrodes are installed in an AEF vacuum chamber arranged in a hollow portion of yokes of said deflection magnet.

3. An irradiation system with an ion beam/charged particle beam according to claim 1, wherein said deflection magnet includes side yokes, an upper yoke, and a lower yoke, and said yokes of said deflection magnet are formed into a general window-frame shape having a hollow portion at its center and is configured that a beam line passes through the hollow portion, and wherein an AEF vacuum chamber is provided in the hollow portion of said yoke and said deflection electrodes are installed in said AEF vacuum chamber.

4. An irradiation system with an ion beam/charged particle beam according to claim 2 or 3, wherein a side view of each side yoke of said deflection magnet has a almost sector shape with no face rotational angle and the upper yoke is long in the longitudinal direction and the lower yoke is long in a direction perpendicular to the longitudinal direction.

5. An irradiation system with an ion beam/charged particle beam claim 2 or 3, wherein said AEF vacuum chamber is fixedly supported by a process vacuum chamber which is installed at a downstream side of said deflection magnet.

6. An irradiation system with an ion beam/charged particle beam according to claim 5, wherein said AEF vacuum chamber is supported by a support rod on an upstream side thereof.

7. An irradiation system with an ion beam/charged particle beam according to claim 4, wherein electron suppression electrodes are respectively installed at upstream and downstream sides of said deflection electrodes in said AEF vacuum chamber and both upper and lower electrodes are supplied with a high voltage.

8. An irradiation system with an ion beam/charged particle beam according to claim 2 or 3, wherein said deflection electrodes are formed as a unit and are pushable into and drawable from said AEF vacuum chamber by the use of rails.

9. An irradiation system with an ion beam/charged particle beam according to claim 8, wherein one of side yokes of magnetic poles of said deflection magnet is supported so as to be separately movable from upper and lower yokes in order to allow said deflection electrodes to be pushable into and drawable from said AEF vacuum chamber.

10. An irradiation system with an ion beam/charged particle beam according to claim 2 or 3, wherein a through hole is formed in said both magnetic poles (side yokes) of said deflection magnet so as to perform a power feed to said deflection electrodes through said through hole.

11. An irradiation system with an ion beam/charged particle beam according to claim 1, wherein the inner surface of each said deflection electrodes has such a curvature that matches with a radius of curvature of the center trajectory of the beam.

12. An irradiation system with an ion beam/charged particle beam according to claim 1, wherein said energy filter comprises a beam dump for receiving thereon a neutralized beam, a beam having a different energy and ions of different charge state.

13. An irradiation system with an ion beam/charged particle beam which is configured that an ion beam/charged particle beam analyzed by a mass analysis electromagnet is introduced to deflection electrodes or a deflection magnet for scanning, then is caused to pass through a beam parallelizing device formed by electrodes or a magnet, then is accelerated or decelerated, then is subjected to an energy analysis by an energy filter configured to bend the beam at a uniform angle at any positions overall in a scanning-deflection area thereof, and then is incident on an irradiation target, wherein said energy filter comprises deflection electrodes and a deflection magnet, a switching device is provided to switch among said deflection electrodes and said deflection magnet and both of them depending on a conditions for the use of the ion beam/charged particle beam, and said deflection electrodes are installed with respect to said deflection magnet such that the turning point of the trajectory of the ion beam/charged particle beam bent by said deflection electrodes and said turning point of said trajectory of the ion beam/charged particle beam bent by said deflection magnet are identical.

14. An irradiation system with an ion beam/charged particle beam according to claim 13, wherein the trajectory of the ion beam/charged particle beam in the energy analysis by said deflection electrodes and the trajectory of the ion beam/charged particle beam in the energy analysis by said deflection magnet overlap each other on a beam incident side and a beam outgoing side of said energy filter.

15. An irradiation system with an ion beam/charged particle beam which is configured that an ion beam/charged particle beam purified by a mass analysis and having an elliptical or oval cross-section that is long in the scanning direction is subjected to an energy analysis by an energy filter configured to bend the beam at a uniform angle at any positions overall in a scanning-deflection area thereof and then is incident on an irradiation target, wherein said energy filter comprises deflection electrodes and a deflection magnet, a switching device is provided to switch among said deflection electrodes, and said deflection magnet and both of them depending on a conditions for the use of the ion beam/charged particle beam, and said deflection electrodes are installed with respect to said deflection magnet such that the turning point of the trajectory of the ion beam/charged particle beam bent by said deflection electrodes and said turning point of said trajectory of the ion beam/charged particle beam bent by said deflection magnet are identical.

16. An irradiation system with an ion beam/charged particle beam according to claim 15, wherein the trajectory of the ion beam/charged particle beam in the energy analysis by said deflection electrodes and the trajectory of the ion beam/charged particle beam in the energy analysis by said deflection magnet overlap each other on the upstream side and the downstream side of the energy filter.

17. An irradiation system with an ion beam/charged particle beam according to claim 4, wherein said AEF vacuum chamber is fixedly supported by a process vacuum chamber which is installed at a downstream side of said deflection magnet.

18. An irradiation system with an ion beam/charged particle beam according to claim 17, wherein said AEF vacuum chamber is supported by a support rod on an upstream side thereof.

* * * * *